(12) United States Patent
Grosso

(10) Patent No.: US 9,460,244 B2
(45) Date of Patent: Oct. 4, 2016

(54) MODULAR UNIT FOR STIMULATING PERFORMANCE IN MULTI-LINES DIGITAL SUBSCRIBER LINE (XDSL) SYSTEM

(75) Inventor: Renato Grosso, Genoa (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 699 days.

(21) Appl. No.: 13/885,294

(22) PCT Filed: Nov. 16, 2010

(86) PCT No.: PCT/SE2010/051253
§ 371 (c)(1),
(2), (4) Date: May 14, 2013

(87) PCT Pub. No.: WO2012/067552
PCT Pub. Date: May 24, 2012

(65) Prior Publication Data
US 2013/0238308 A1    Sep. 12, 2013

(51) Int. Cl.
  G06F 17/50    (2006.01)
  H04B 3/40    (2006.01)
  H04B 3/487    (2015.01)
  H04M 3/30    (2006.01)
  H04M 3/34    (2006.01)

(52) U.S. Cl.
  CPC ............ G06F 17/5009 (2013.01); H04B 3/40 (2013.01); H04B 3/487 (2015.01); H04M 3/305 (2013.01); H04M 3/34 (2013.01)

(58) Field of Classification Search
  None
  See application file for complete search history.

(56) References Cited

U.S. PATENT DOCUMENTS

| 6,418,401 | B1 * | 7/2002 | Dansky | G06F 17/5036 703/13 |
| 2002/0136397 | A1 * | 9/2002 | Zeng | H04B 3/487 379/417 |
| 2006/0233228 | A1 * | 10/2006 | Liang | H04M 11/062 375/222 |
| 2008/0215300 | A1 * | 9/2008 | Sarkkinen | H04B 17/3912 703/4 |
| 2009/0141644 | A1 | 6/2009 | Ploumen | |
| 2011/0007623 | A1 * | 1/2011 | Cendrillon | H04B 3/32 370/201 |

FOREIGN PATENT DOCUMENTS

WO    WO 2006/136645 A1    12/2006

* cited by examiner

Primary Examiner — Omar Fernandez Rivas
Assistant Examiner — Herng-Der Day

(57) ABSTRACT

According to embodiments of the present invention, a multi-lines cable simulator is provided which is able to simulate also crosstalk between lines. The multi-lines cable simulator is comprised in a modular unit configured to simulate increased number of lines by means adding further modular units. According to further embodiments, the modular unit is configured to also simulate increased line length by means of adding further modular units.

10 Claims, 11 Drawing Sheets

MODULAR UNIT FOR STIMULATING PERFORMANCE IN MULTI-LINES DIGITAL SUBSCRIBER LINE (XDSL) SYSTEM

TECHNICAL FIELD

The present invention relates to a modular unit for simulating performance in multi-lines Digital Subscriber Line (xDSL) system, such as a VDSL2 (Very high bit rate DSL) Vectoring system.

BACKGROUND

In order to achieve a higher performance in multi-lines xDSL, the need for high density multiple input multiple output (MIMO) systems will be increased in the future using multi-lines bonded solutions. Examples of multi-lines bonded solutions are G.998.x bonded xDSL and G.993.5 vectoring_DSM3 (Dynamic Spectrum Management of Level 3) systems. For instance, vectoring_DSM3 systems is going to be available on the market at constantly increased number of pairs starting with 2 pairs, but 4, 6, 8 up to tens (48 or 96 pairs) and even hundreds (192, 384) are foreseen. In this context a pair is two twisted copper wires which also can be referred to as a line, link, cable and channel.

A representative testing environment for multi-lines xDSL performance of advanced processing capable equipments, which may imply tens or hundred of lines in a MIMO system, can today only be achieved by means of a real multi-lines cable.

A 500 meter cable with 24-pairs is a drum of 1 m×1 m having a weight of 100 kg. Such a cable is not easy to handle. It is therefore desired to be able to verify multi-lines bonded solutions in lab and production environments by means of an easy to handle, flexible and modular system simulating the multi-lines cable.

SUMMARY

As stated above, it is desired to be able to verify multi-lines system solutions in lab and production environments even in case of large number of lines and/or long loops length. Moreover, it would be desired to adjust the number of pairs and the length of the cable lines which is not easy if not simply impossible in the existing lab environment based on real multi-lines cables According to embodiments of the present invention, a multi-lines cable simulator is provided which is able to simulate also crosstalk between lines. The multi-lines cable simulator is comprised in a modular unit configured to simulate increased number of lines by means adding further modular units. According to further embodiments, the modular unit is configured to also simulate increased line length by means of adding further modular units.

Accordingly, a modular unit for simulating performance of a multi-lines cable between a Central Office (CO) and several Customer Premises Equipments (CPEs) is provided according to embodiments of the present invention. The modular unit comprises a first set of n connectors and a second set of n connectors configured to connect in a first dimension the modular unit between the CO and the CPE. The modular unit further comprises at least a first crosstalk simulator configured to simulate crosstalk between a first bundle of n number of lines and a first length simulator configured to simulate a first predefined line length, a third set of n connectors configured to connect the modular unit with a second modular unit in a second dimension, wherein the second modular unit comprises a second bundle of n number of lines denoted line1-line4, a second crosstalk simulator configured to simulate crosstalk between the second bundle of n number of lines and a second length simulator configured to simulate a second predefined line length. The modular unit further comprises a fourth set of n connectors configured to connect the modular unit with a third modular unit in a second dimension, wherein the third modular unit comprises a third bundle of n number of lines and a third crosstalk simulator configured to simulate crosstalk between the third bundle of n number of lines and a third length simulator configured to simulate a third predefined line length. Thus the first crosstalk simulator is further configured to simulate crosstalk within the first n bundle of lines by taking into account crosstalk from at least one of the second and third bundles of lines when connected.

An advantage of embodiments of the present invention is that a solution is provided which is scalable and easy to manage. The solution satisfies any testing exigency such as integration, production, etc.

Moreover the compact design of the solution allows proper electromagnetic shielding by means of a suitable mechanic. When testing performance, the test environment should be free from undesired impairments that may jeopardize the testing. However, in test environment there are often electromagnetic interferences emitted by e.g. adjacent equipments, radio transmissions, mobile phones, etc. Such electromagnetic fields can be captured by the test environment as function of the exposition, such as for instance a very long unshielded cable or more in general any unshielded element of the test environment will capture a large portion of such undesired electromagnetic field, which will translate into undesired and unpredictable additional noise, that could jeopardize the test result. Since the embodiments of the present invention provide a very compact design, the given modular units can be easily screened by means of metallic enclosure, which will get the test environment insensible to such undesired effects.

DETAILED DESCRIPTION

Figure 1:
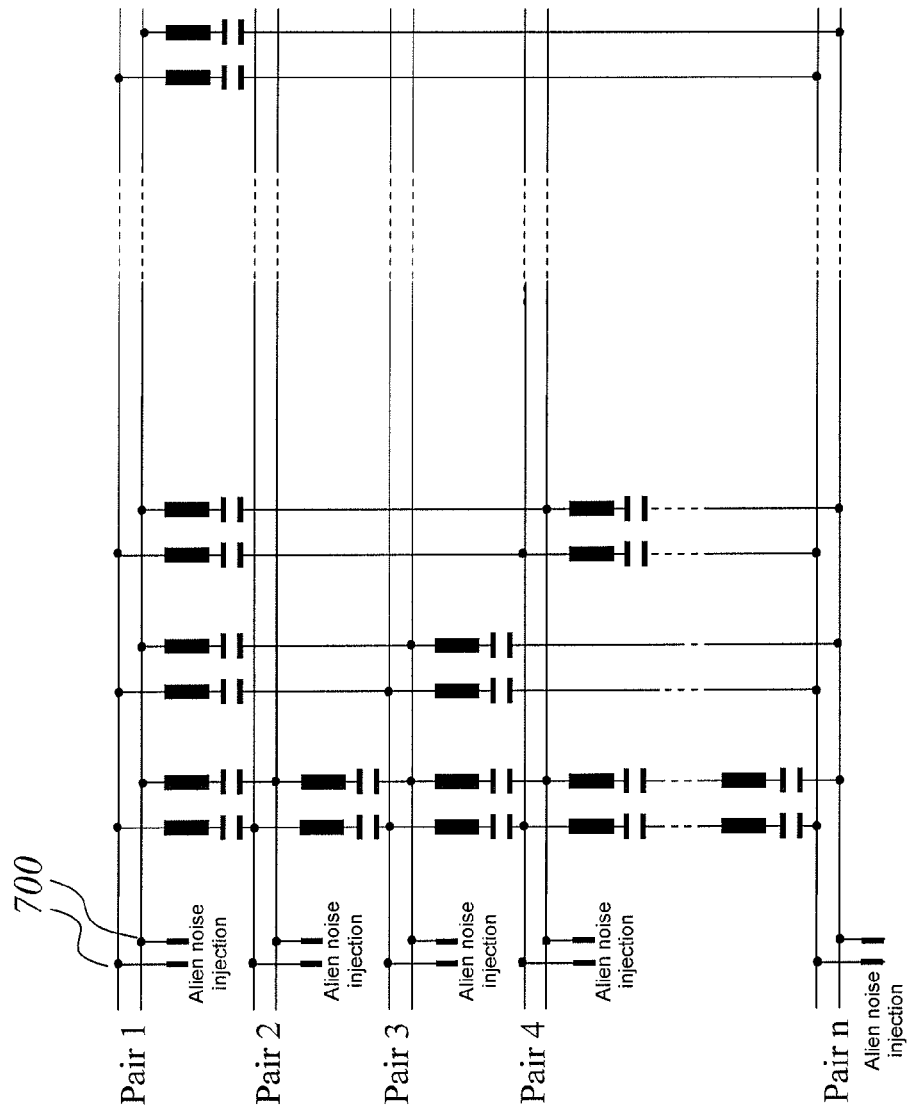
FIG. 1 illustrates an N-pair crosstalk simulator according to embodiments of the present invention.

The embodiments of the present invention will be described more fully hereinafter with reference to the accompanying drawings, in which preferred embodiments of the invention are shown. The embodiments may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like reference signs refer to like elements.

Moreover, those skilled in the art will appreciate that the means and functions explained herein below may be implemented using software functioning in conjunction with a programmed microprocessor or general purpose computer, and/or using an application specific integrated circuit (ASIC). It will also be appreciated that while the current embodiments are primarily described in the form of methods and devices, the embodiments may also be embodied in a computer program product as well as a system comprising a computer processor and a memory coupled to the processor, wherein the memory is encoded with one or more programs that may perform the functions disclosed herein.

In single pair xDSL scenarios, a well controlled single noise source and loop length simulator was enough to fully and carefully characterize the DUT (Device Under Test). However in multi-lines MIMO signal processing systems such as G.998.x bonded xDSL solutions and/or G.993.5 Vectoring_DSM3, mutual coupling crosstalk of each single noise source on each pair have to be considered as mentioned above. Thus for multi-lines solutions it is no more acceptable to consider each pair as individually processed independently of the others. In vectored_DSM3 MIMO physical layer systems, simultaneous injection of a single noise source into multiple pairs is not representative of real deployments and not suitable for crosstalk canceling signal processing evaluation, resulting in wrongly performance estimation.

The received Discrete Multi Tone (DMT) signals for the multi-lines xDSL can be modeled by the following equation which holds at each DMT tone index.

$$\begin{bmatrix} y_1 \\ y_2 \\ \vdots \\ \vdots \\ \vdots \\ y_n \end{bmatrix} = \begin{bmatrix} h_{1,1} h_{1,2} \ldots h_{1,n} \\ h_{2,1} h_{2,2} \ldots h_{2,n} \\ \vdots \\ \vdots \\ \vdots \\ h_{n,1} h_{n,2} \ldots h_{n,n} \end{bmatrix} \begin{bmatrix} Tx_1 \\ Tx_2 \\ \vdots \\ \vdots \\ \vdots \\ Tx_n \end{bmatrix}_{Group} + \begin{bmatrix} n_{1,1} n_{1,2} \ldots n_{1,m} \\ n_{2,1} n_{2,2} \ldots n_{2,m} \\ \vdots \\ \vdots \\ \vdots \\ n_{n,1} n_{n,2} \ldots n_{n,m} \end{bmatrix} \begin{bmatrix} Tx_1 \\ Tx_2 \\ \vdots \\ \vdots \\ \vdots \\ Tx_m \end{bmatrix}_{NEXT} +$$

$$\begin{bmatrix} f_{1,1} f_{1,2} \ldots f_{1,m} \\ f_{2,1} f_{2,2} \ldots f_{2,m} \\ \vdots \\ \vdots \\ \vdots \\ f_{n,1} f_{n,2} \ldots f_{n,m} \end{bmatrix} \begin{bmatrix} Tx_1 \\ Tx_2 \\ \vdots \\ \vdots \\ \vdots \\ Tx_m \end{bmatrix}_{FEXT} + \begin{bmatrix} 10 \ldots 0 \\ 01 \ldots 0 \\ \vdots \\ \vdots \\ \vdots \\ 00 \ldots 1 \end{bmatrix} \begin{bmatrix} v_1 \\ v_2 \\ \vdots \\ \vdots \\ \vdots \\ v_n \end{bmatrix}$$

In the equation above, the matrices H, N and F represents the coupling matrices from transmitters in the group, generating NEXT (near end crosstalk) and FEXT (far end crosstalk), respectively. V represents the externally injected noise, e.g. white noise, or any other sort of alien noise. In each receiver, white noise (e.g. at −140 dBm/Hz) may also be experienced, as well as any other sort of alien noise wherein alien noise is noise generated by sources not parts of the given MIMO system.

An N-pair crosstalk simulator is shown in FIG. 1, where coupling elements are R+C networks (Resistor Capacitance network). However, other coupling elements/networks, passive or active, fixed or programmable, can be adopted for this purpose. A dedicated connector 700 for each line for alien noise injection may be used as in FIG. 1.

Figure 2:
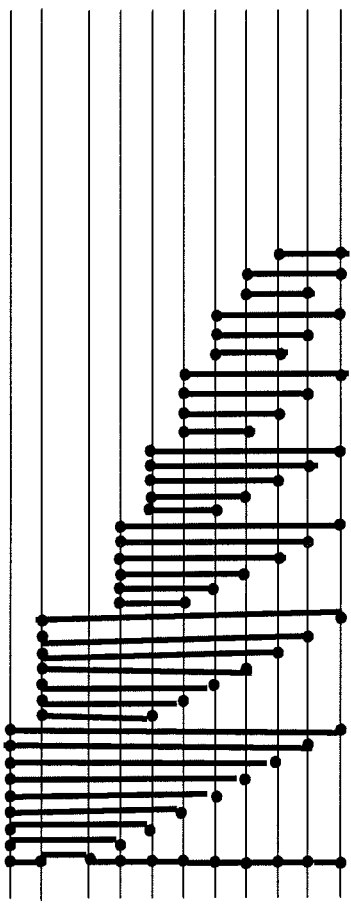
FIG. 2 illustrates the number of connections (i.e. crosstalk modes) needed to simulate crosstalk for n lines.

Consider the case when n=10. Crosstalk occurs between all lines and in order to simulate the crosstalk a number of coupling elements are used. As illustrated in FIG. 2, 45 coupling elements are needed.

Assuming n=96, 4560 coupling elements are needed to simulate the crosstalk. The coupling elements may be dimensioned taking into account the binder structure, where certain lines are closer to each other, but a little farer to other lines, although part of the same binder.

Figure 3:
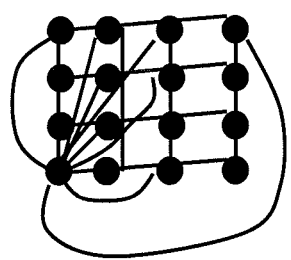
FIG. 3 illustrates crosstalk modes types from line 1 to the other lines, where just one type per line is shown.

Suitable crosstalk coupling elements are exemplified by R+C elements, where R may be 22 ohm, and C may vary from a maximum of 47 pF for closer lines to 10 pF for farer lines. However, other different types of coupling elements can be adopted, e.g. coupling transformers, active elements with constant or variable/programmable coupling function. As a good approximation of a real cable structure, the "squared" geometry distribution is adopted as shown in FIG. 3, for simplicity.

In the case above when n=16, a total of eight different coupling networks can be identified. The strongest crosstalk can be found between neighboring lines (22 ohm, 47 pF) while the weakest crosstalk can be found between the lines furthest away from each other. See FIG. 3 and the table below.

| R [ohm] | 22 | 22 | 22 | 22 | 22 | 22 | 22 | 22 | 22 |
|---|---|---|---|---|---|---|---|---|---|
| C [pF] | 47 | 39 | 33 | 30 | 27 | 22 | 18 | 15 | 10 |

To simulate 16 lines as in the example above, 120 coupling elements are required.

As stated above, it is desired to be able to verify multi-lines bonded solutions in lab and production environments. Moreover, it would be desired to adjust the number of pairs and the length of the cables which is not possible in the existing lab environment. It should be noted that the terms cable, line, channel are used interchangeably in this specification. Further, in this specification each line is constituted by two twisted copper wires, also referred to as pairs, but any other kind of multi-line copper system (cable) can be simulated by means of the embodiments of the present invention, such as untwisted pairs, or single wires.

To be able to adjust the number of pairs, a modular unit comprising a multi-lines cable simulator is provided according to embodiments of the present invention. The multi-lines cable simulator is able to simulate crosstalk between cable pairs. The modular unit can for example be configured to simulate 16 lines and 100 meter artificial cable segment. By adding further multiple modular units it is possible to simulate an increased number of pairs.

Figure 4:
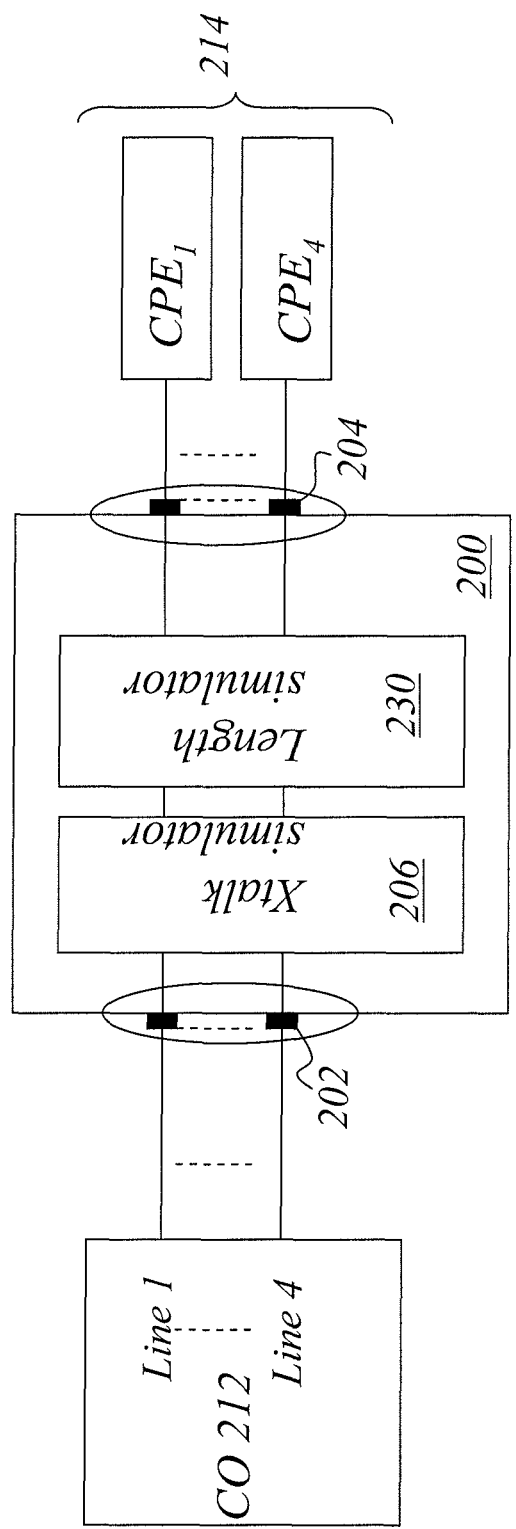
FIG. 4 illustrates a modular unit according to embodiments of the present invention, wherein the module is connected between a Central Office (CO) and a plurality of Customer Premises Equipments (CPEs).

Turning now to FIG. 4 showing an embodiment of the present invention, where a Central Office (CO) 212 is connected to a modular unit 200. The modular unit 200 comprises a crosstalk simulator 206 and is further connected to a plurality of CPEs (Customer Premises Equipment) 214. A plurality of lines denoted line1 . . . line 4 from the CO 212 are connected to the modular unit via a first set of connectors 202. These lines are further connected to a respective CPE 214 via a second set of connectors 204. Each modular unit 200 is configured to simulate a predefined number of lines and each modular unit 200 comprises a respective length simulator 230 simulating a respective predefined line length. By connecting e.g. an additional modular unit to a first modular unit, it is possible to increase the number of lines for which performance are simulated wherein crosstalk between all lines can be taken into account.

Figure 5:
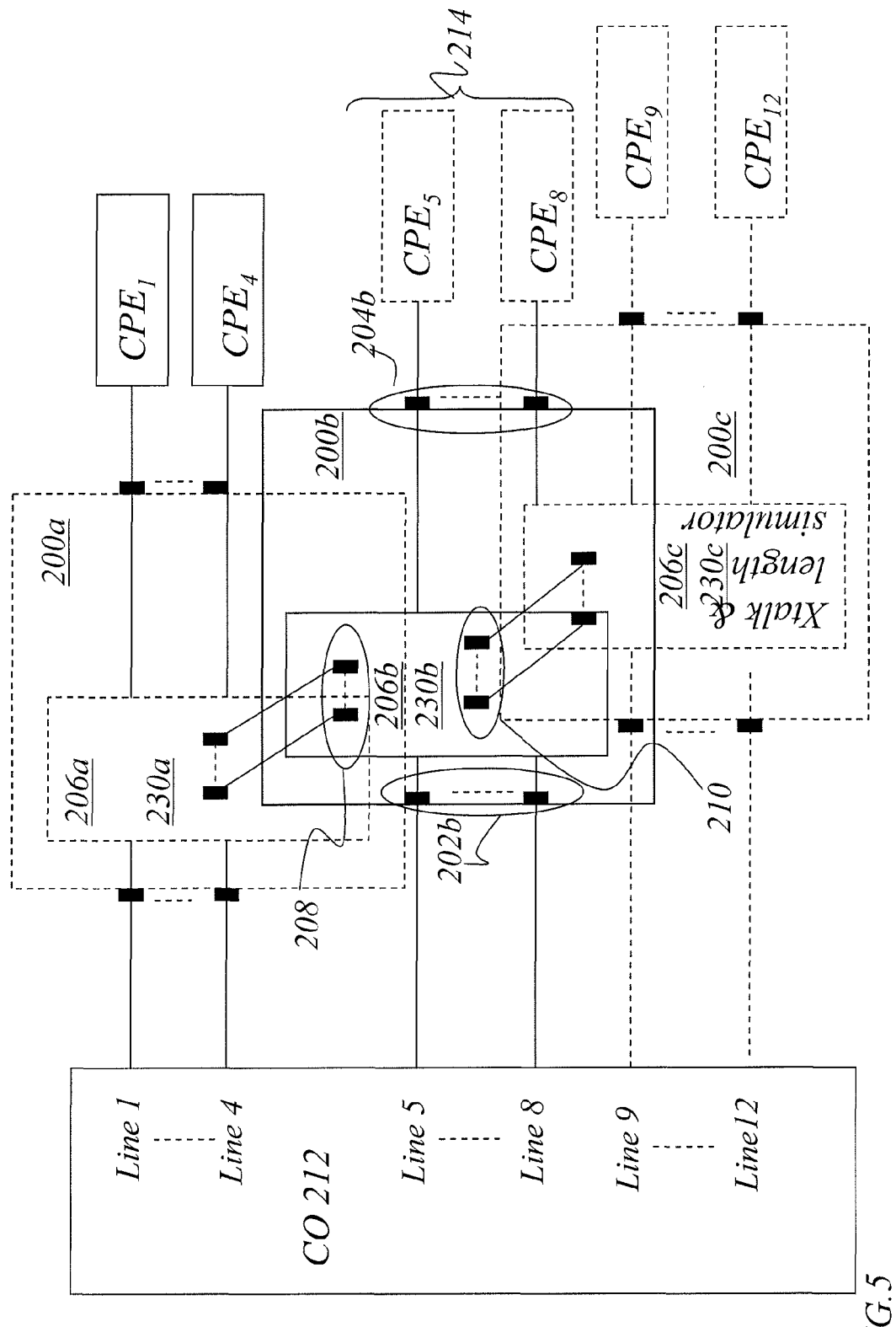
FIG. 5 illustrates three modular units for extending the number of simulated lines according to embodiments of the present invention.

FIG. 5 illustrates schematically three modular units 200a, 200b, 200c. Each modular unit is configured to simulate 4 lines with a predetermined line length. Thus by connecting three modular units from a CO 212 to respective CPEs, 12 lines can be simulated. FIG. 5 is explained by starting from one of the modular units referred to as a first modular unit denoted 200b.

The first modular unit 200b comprises a first set of n connectors 202b and a second set of n connectors 204b configured to connect in a first dimension the modular unit 200b between the CO 212 and the CPEs 214. In this example n=4. It should however be noted that the embodiments of the present invention is not limited to n=4. Moreover, "n" can vary between the different modular units. However it would be beneficial if the modular units are square such as 2×2 lines, 3×3 lines, 4×4 lines etc.

The first modular unit 200b comprises at least a first crosstalk simulator 206b configured to simulate crosstalk between a first bundle of n number of lines e.g. line5, . . . line8, a third set of n connectors 208 configured to connect the modular unit 200b with a second modular unit 200a in a second dimension. Further, the second modular unit 200a comprises a second bundle of n number of lines denoted line1, . . . line4 and a second crosstalk simulator 206a. When the first and the second modular units are connected, the first crosstalk simulator 206b is further configured to simulate crosstalk between the first, n bundle of lines by taking into account crosstalk from the second bundles of lines.

According to a further embodiment, the modular unit 200b comprises also a fourth set of n connectors 210 configured to connect the modular unit 200b with a third modular unit 200c in a second dimension. The third modular unit 200c comprises a third bundle of n number of lines denoted e.g. line 9, . . . line 12 and a third crosstalk simulator 206c wherein the first crosstalk simulator 206b is further configured to simulate crosstalk between the first, n bundle of lines by taking into account crosstalk from at least one of the second and third bundles of lines when the second and third modular units are connected.

As mentioned above, each modular unit has a dedicated crosstalk simulator which is configured to send crosstalk contributions through the connectors towards the crosstalk simulators of the connected modular units and each modular unit is configured to receive crosstalk contributions coming at the connectors from the crosstalk simulators of the connected modular units. In this way, each crosstalk simulator can determine the crosstalk between the lines of one modular unit taking the crosstalk from adjacent modular units into account.

Figure 6:
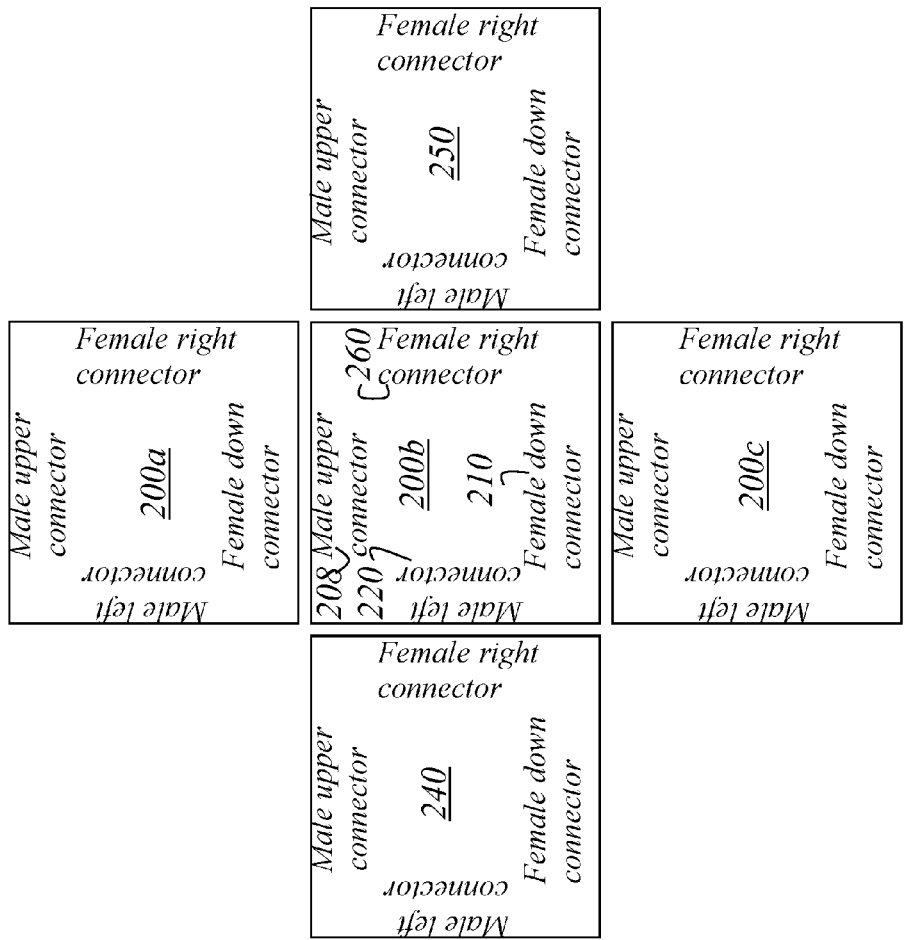
FIG. 6 illustrates five modular units and their connectors according to embodiments of the present invention.

In FIG. 6, a fifth set 220 and a sixth set 260 of n connectors are illustrated. The fifth set of n connectors are configured to connect the modular unit 200b with a fourth modular unit 240 in a third dimension comprising a fourth bundle of n number of lines and the sixth set of n connectors configured to connect the modular unit 200b with a fifth modular unit 250 in the third dimension comprising a fifth bundle of n number of lines. In this example, each modular unit comprises male upper connector, female lower connector, male left connector and female right connector. In this way the modular units can be connected in a flexible way which results in that the simulated number of lines easily can be extended. It should be noted that the connectors shown in FIG. 6 shows that the modular units are connected in the second and third dimension while the modular units also comprise connectors (not shown in FIG. 6) configured to connect the modular units in the first dimension to expand the simulated line length.

Thus, the fourth and the fifth modular unit comprises a respective crosstalk simulator configured to simulate crosstalk between the respective bundle of n number of lines and a respective length simulator configured to simulate a respective line length, wherein the first crosstalk simulator 206b is further configured to simulate crosstalk within the first, n bundle of lines by taking into account crosstalk from at least one of the second, third, fourth and fifth bundles of lines when connected.

Figure 7:
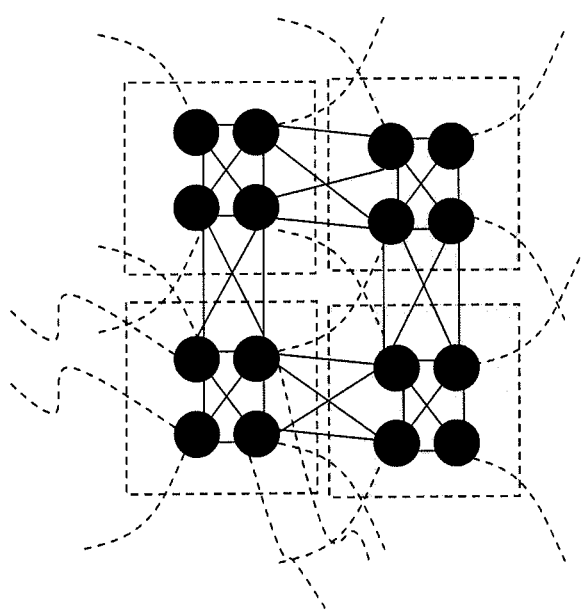
FIG. 7 illustrates four modular units and shows how some crosstalk modes are distributed within and between the modular units.
Figure 8:
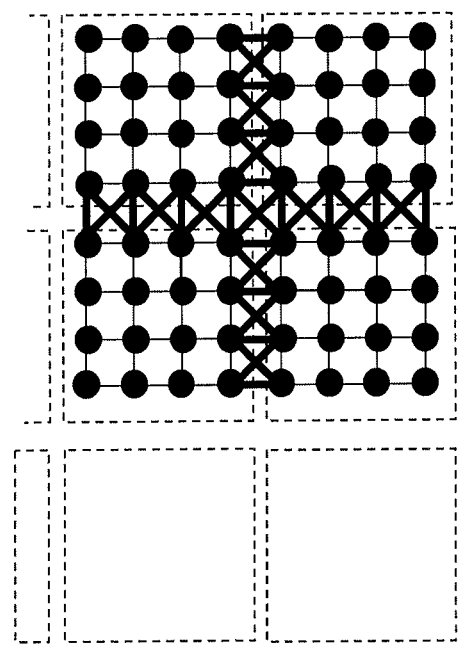
FIG. 8 exemplifies how the crosstalk between the modular units can be simplified by only taking into consideration some of the worst crosstalk distribution modes.

When extending the number of the simulated lines by connecting several modular units, crosstalk between the lines on the different modules is taken into account by means of the connectors. FIG. 7 shows the crosstalk between the different lines on four modular units, wherein each modular unit is configured to simulate four lines. In principle any inter-module crosstalk coupler should be connected, but an acceptable compromise could be to just connect the most important crosstalk coupler between different modular units. However, in order to simplify the simulation it is possible to take into account the crosstalk within one modular unit and only the strongest crosstalk which occurs between different modular units, i.e. the crosstalk between the lines closest to each other on different modular units. FIG. 8 shows where the strongest crosstalk occurs between different modular units.

According to a further embodiment referring again to FIG. 5 and FIG. 9, the first set of n connectors 202b and the second set of n connectors 204b are configured to connect in the first dimension the modular unit to at least a sixth modular unit 900 between the CO and the CPE. In this way, the simulated line length can be extended. I.e. if a first modulator unit is configured to simulate a line length of 100 meter and a second modular unit is configured to simulate a line length of 100 meter, the total simulated line length is 200 meter. The sixth modular unit 900 comprises a sixth bundle of n number of lines, a crosstalk simulator configured to simulate crosstalk between the sixth bundle of n number of lines, and a length simulator configured to simulate a predefined sixth line length.

Figure 9:
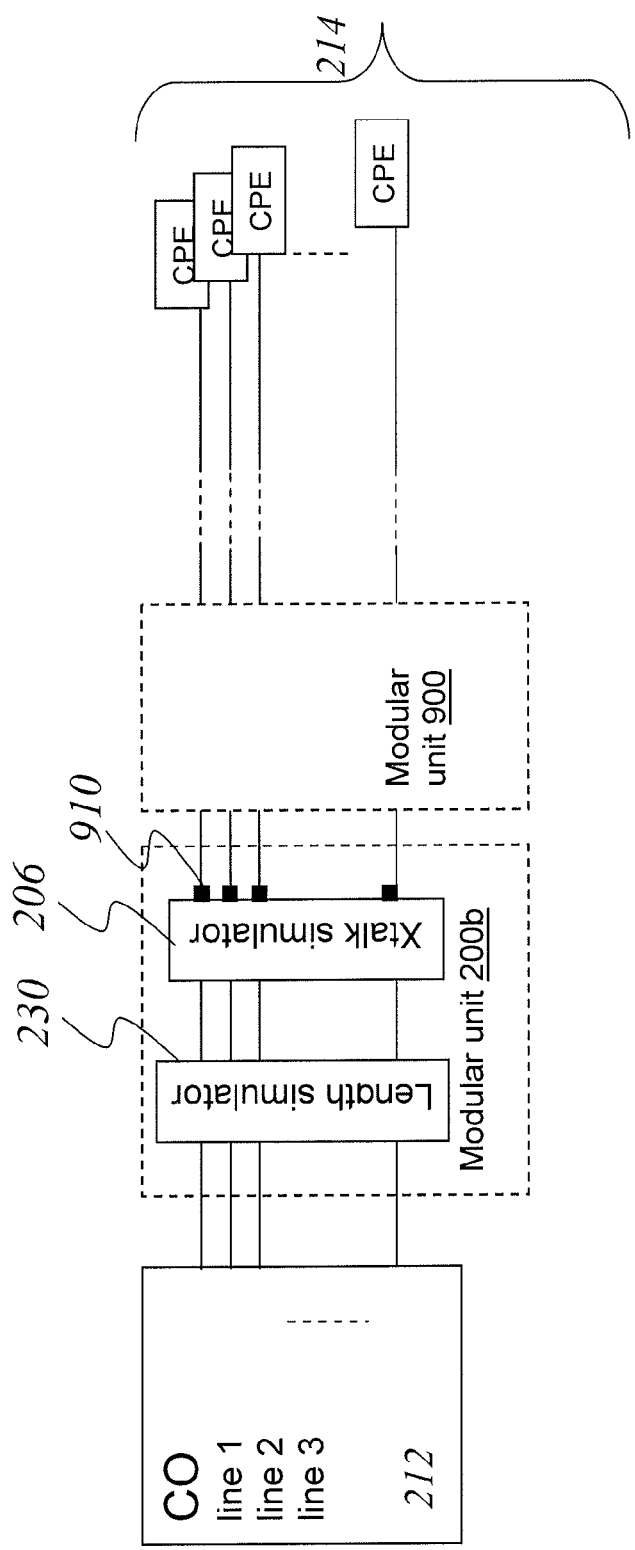
FIG. 9 illustrates two modular units for extending the length of the simulated lines according to embodiments of the present invention.
Figure 10:
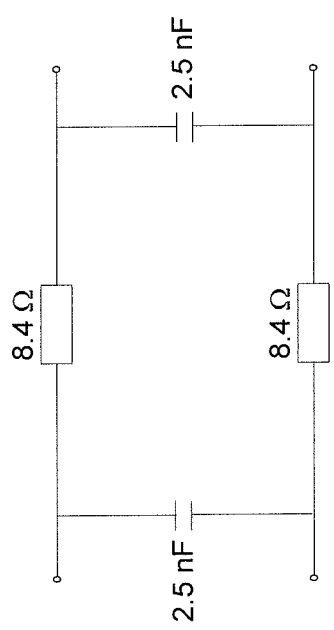
FIG. 10 exemplifies a possible attenuation network which can be used in connection with embodiments of the present invention.

Moreover, in connection with the crosstalk simulator an attenuation simulator network 910 can be added for each line as illustrated in FIG. 9. An example of an attenuation simulator network is shown in FIG. 10.

Figure 11:
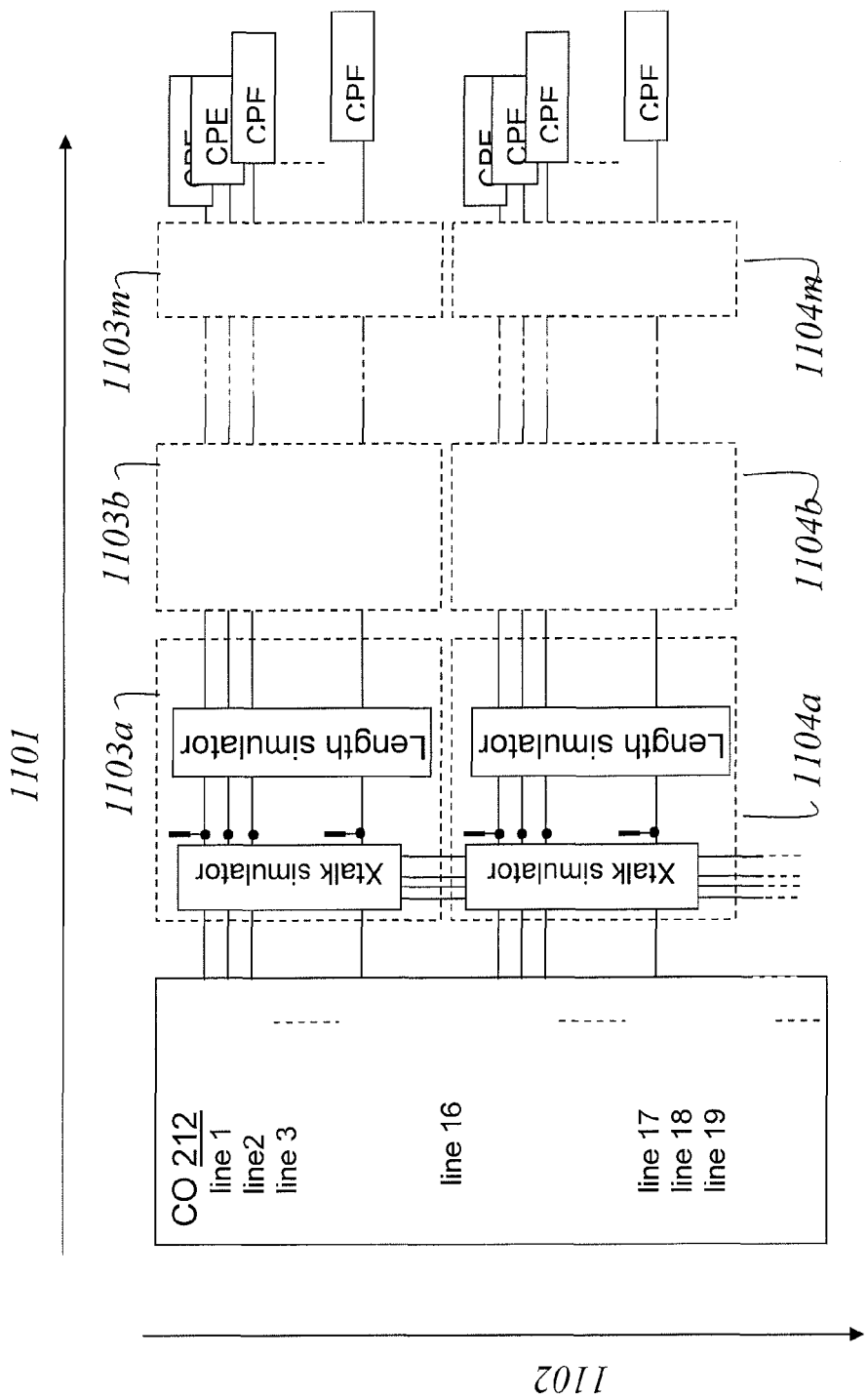
FIG. 11 shows an example when both the number of simulated lines and the length of the simulated lines are extended by adding more modules according to embodiments of the present invention.

Turning now to FIG. 11, illustrating how both the number of simulated lines and the length can be extended by adding additional multiple modular units. The length of the simulated lines are extended by the modular units 1103b and 1104b, 1103m, 1104m in one dimension 1101 and the number of simulated lines are extended by the modular units 1104a and 1104b, 1104m in another dimension 1102. The length simulator of the modular units may simulate the same length or different lengths. It is assumed in this embodiment that the modular units are identical. In addition, it should be noted that the simulated length may vary asymmetrically, which implies for instance that the modular unit denoted 1104*m* and 1104*b* may be removed while the modular unit 1103*m* and 1103*b* are kept, to simulate CPEs placed at different distances within the same multi-lines cable, assuming that each length simulator of the modular units are simulating the same length.

Moreover in FIG. 11, modular units are added in the second dimension to extend the number of lines but it is possible to also add modular units in a third dimension (not shown) to extend the number of lines further.

Modifications and other embodiments of the disclosed invention will come to mind to one skilled in the art having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of this disclosure. Although specific terms may be employed herein, they are used in a generic and descriptive sense only and not for purposes of limitation.

The invention claimed is:

1. A modular unit for simulating performance of a multi-lines cable between a Central Office (CO) and several Customer Premises Equipments (CPEs); the modular unit comprises:
    a first set of n connectors and a second set of n connectors configured to connect in a first dimension the modular unit between the CO and the CPEs;
    a first crosstalk simulator configured to simulate crosstalk within a first bundle of n number of lines and a first length simulator configured to simulate a first predefined line length; and
    a third set of n connectors configured to connect the modular unit with a second modular unit in a second dimension,
    wherein the second modular unit comprises:
        a second crosstalk simulator configured to simulate crosstalk within a second bundle of n number of lines; and
        a second length simulator, wherein the second length simulator is configured to simulate a second predefined line length,
    wherein the first crosstalk simulator is further configured to simulate crosstalk within the first bundle of n number of lines by taking into account crosstalk from the second bundle of n number of lines when the modular unit is connected to the second modular unit,
    wherein the second crosstalk simulator is further configured to simulate crosstalk within the second bundle of n number of lines by taking into account crosstalk from the first bundle of n number of lines when the second modular unit is connected to the modular unit, and
    wherein the first and second crosstalk simulators comprise a line connector for each line of the first bundle of n number of lines and the second bundle of n number of lines, each of the line connectors configured to receive alien noise injection.

2. The modular unit according to claim 1, the modular unit further comprises:
    a fourth set of n connectors configured to connect the modular unit with a third modular unit in the second dimension, wherein the third modular unit comprises a third bundle of n number of lines and a third crosstalk simulator configured to simulate crosstalk within the third bundle of n number of lines and a third length simulator configured to simulate a third predefined line length, and wherein the first crosstalk simulator is further configured to simulate crosstalk within the first bundle of n number of lines by taking into account crosstalk from at least one of the second and third bundles of n number of lines when the modular unit is correspondingly connected to at least one of the second modular unit and the third modular unit.

3. The modular unit according to claim 2, further comprising:
    a fifth set of n connectors configured to connect the modular unit with a fourth modular unit in a third dimension comprising a fourth bundle of n number of lines, and
    a sixth set of n connectors configured to connect the modular unit with a fifth modular unit in the third dimension comprising a fifth bundle of n number of lines, wherein the fourth and the fifth modular unit comprises a respective crosstalk simulator configured to simulate crosstalk within the respective bundle of n number of lines and a respective length simulator configured to simulate a respective line length, wherein the first crosstalk simulator is further configured to simulate crosstalk within the first bundle of n number of lines by taking into account crosstalk from at least one of the second, third, fourth and fifth bundles of n number of lines when the modular unit is correspondingly connected to at least one of the second, third, fourth, and fifth modular units.

4. The modular unit according to claim 1, wherein the first set of n connectors and the second set of n connectors are configured to connect in a first dimension the modular unit to at least a sixth modular unit between the CO and the CPEs, to extend the simulated line length, wherein the sixth modular unit comprises a sixth bundle of n number of lines, a crosstalk simulator configured to simulate crosstalk within the sixth bundle of n number of lines, and a length simulator configured to simulate a predefined sixth line length.

5. The modular unit according to claim 1, wherein the modular unit comprises an attenuation simulator network for each line of the first bundle of n number of lines.

6. A system for simulating performance of a multi-lines cable comprising:
    a Central Office (CO);
    a plurality of Customer Premises Equipments (CPEs);
    a first modular unit; and
    a second modular unit;
    wherein the first modular unit comprises:
        a first set of n connectors and a second set of n connectors configured to connect in a first dimension the first modular unit between the CO and the CPEs;
        a first crosstalk simulator configured to simulate crosstalk within a first bundle of n number of lines and a first length simulator configured to simulate a first predefined line length; and
        a third set of n connectors configured to connect the first modular unit with a second modular unit in a second dimension,
    wherein the second modular unit comprises:
        a second crosstalk simulator configured to simulate crosstalk within a second bundle of n number of lines; and
        a second length simulator, wherein the second length simulator is configured to simulate a second predefined line length, wherein the first crosstalk simulator is further configured to simulate crosstalk within the first bundle of n number of lines by taking into account crosstalk from the second bundle of n number of lines when the first modular unit is connected to the second modular unit, wherein the second crosstalk simulator is further configured to simulate crosstalk within the second bundle of n number of lines by taking into account crosstalk from the first bundle of n number of lines when the second modular unit is connected to the first modular unit, and wherein the first and second crosstalk simulators comprise a line connector for each line of the first bundle of n number of lines and the second bundle of n number of lines, each of the line connectors configured to receive alien noise injection.

7. The system according to claim 6, wherein the first modular unit further comprises:

a fourth set of n connectors configured to connect the first modular unit with a third modular unit in the second dimension, wherein the third modular unit comprises a third crosstalk simulator configured to simulate crosstalk within a third bundle of n number of lines and a third length simulator configured to simulate a third predefined line length, and wherein the first crosstalk simulator is further configured to simulate crosstalk within the first bundle of n number of lines by taking into account crosstalk from at least one of the second and third bundles of n number of lines when the first modular unit is correspondingly connected with at least one of the second modular unit and the third modular unit.

8. The system according to claim 7, further comprising:

a fifth set of n connectors configured to connect the first modular unit with a fourth modular unit in a third dimension associated with a fourth bundle of n number of lines, and a sixth set of n connectors configured to connect the first modular unit with a fifth modular unit in the third dimension associated with a fifth bundle of n number of lines, wherein the fourth and the fifth modular unit comprises a respective crosstalk simulator configured to simulate crosstalk within the respective bundle of n number of lines and a respective length simulator configured to simulate a respective line length, wherein the first crosstalk simulator is further configured to simulate crosstalk within the first bundle of n number of lines by taking into account crosstalk from at least one of the second, third, fourth and fifth bundles of n number of lines when the first modular unit is correspondingly connected to at least one of the second, third, fourth and fifth modular units.

9. The system according to claim 6, wherein the first set of n connectors and the second set of n connectors are configured to connect in a first dimension the first modular unit to at least a sixth modular unit between the CO and the CPEs, to extend the simulated line length, wherein the sixth modular unit is associated with a sixth bundle of n number of lines and comprises a crosstalk simulator configured to simulate crosstalk within the sixth bundle of n number of lines, and a length simulator configured to simulate a predefined sixth line length.

10. The system according to claim 6, wherein the first modular unit comprises an attenuation simulator network for each line of the first bundle of n number of lines.

* * * * *